(12) United States Patent
Yang et al.

(10) Patent No.: US 10,797,724 B2
(45) Date of Patent: Oct. 6, 2020

(54) METHOD AND APPARATUS FOR PROCESSING DATA

(71) Applicant: BEIJING BAIDU NETCOM SCIENCE AND TECHNOLOGY CO., LTD., Beijing (CN)

(72) Inventors: Rui Yang, Beijing (CN); Huayong Wang, Beijing (CN)

(73) Assignee: BEIJING BAIDU NETCOM SCIENCE AND TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/567,950

(22) Filed: Sep. 11, 2019

(65) Prior Publication Data
US 2020/0162103 A1    May 21, 2020

(30) Foreign Application Priority Data
Nov. 15, 2018    (CN) .......................... 2018 1 1359849

(51) Int. Cl.
*H03M 7/30* (2006.01)
*H03M 7/40* (2006.01)

(52) U.S. Cl.
CPC ................................. *H03M 7/4037* (2013.01)

(58) Field of Classification Search
CPC .......................... H03M 7/4037; H03M 7/4043
USPC ......................................... 341/50, 52, 87, 51
See application file for complete search history.

(56) References Cited

U.S. PATENT DOCUMENTS

| | | | | |
|---|---|---|---|---|
| 3,717,851 A | * | 2/1973 | Cocke | H03M 7/4025 711/220 |
| 5,808,570 A | * | 9/1998 | Bakhmutsky | H03M 7/425 341/106 |
| 2010/0274786 A1 | * | 10/2010 | Harris | H04L 45/7457 707/737 |
| 2013/0111164 A1 | * | 5/2013 | Chang | H03M 7/3091 711/162 |
| 2015/0331619 A1 | | 11/2015 | Zheng et al. | |
| 2016/0028766 A1 | * | 1/2016 | Valgenti | H04L 63/1425 726/23 |

* cited by examiner

*Primary Examiner* — Peguy Jean Pierre
(74) *Attorney, Agent, or Firm* — Knobbe, Martens, Olson & Bear LLP (57) ABSTRACT

Method and apparatus for processing data are disclosed. The method may include: sorting to-be-compressed at least one piece of data in a predetermined order; for a sorted piece of data, in response to the data having a common prefix with a previous piece of data of the piece of data, adding the common prefix to a common prefix set; dividing the sorted at least one piece of data into at least one group based on the common prefix set and determining a common prefix of each group; and storing, for a group in the at least one group, a common prefix of the group and a non-common prefix portion of each piece of data in the group, and recording a common prefix corresponding to each piece of data in the each group and a shared length between the each piece of data and the common prefix.

15 Claims, 5 Drawing Sheets

METHOD AND APPARATUS FOR PROCESSING DATA

CROSS-REFERENCE TO RELATED APPLICATIONS

This application claims priority to Chinese Patent Application No. 201811359849.2, filed with the China National Intellectual Property Administration (CNIPA) on Nov. 15, 2018, the content of which is incorporated herein by reference in its entirety.

TECHNICAL FIELD

Embodiments of the present disclosure relate to the field of computer technology, and specifically to a method and apparatus for processing data.

BACKGROUND

A storage system saves data into a storage medium through a storage engine. In some key-value storage engines, data is stored in a form of a string or a binary sequence, and is sequentially arranged in a lexicographical order (for the ease of comparison). At the same time, for the storage system, resources such as memory resources, input and output are positively related to the system performance, and a capacity is positively related to costs. Therefore, effectively compression and comparison without depression are required for the data.

SUMMARY

Embodiments of the present disclosure propose a method and apparatus for processing data.

In a first aspect, some embodiments of the present disclosure provide a method for processing data. The method includes: sorting to-be-compressed at least one piece of data in a predetermined order; for a piece of data in the sorted at least one piece of data, in response to the piece of data having a common prefix with a previous piece of data of the piece of data, adding the common prefix to a common prefix set; dividing the sorted at least one piece of data into at least one group based on the common prefix set and determining a common prefix of each group; and for a group in the at least one group, storing a common prefix of the group and a non-common prefix portion of each piece of data in the group, and recording a common prefix corresponding to each piece of data in the each group and a shared length between the each piece of data and the common prefix.

In some embodiments, the dividing the sorted at least one piece of data into at least one group based on the common prefix set and determining a common prefix of each group includes: determining a local minimum value of a length of a common prefix in the common prefix set; dividing the at least one piece of data into the at least one group according to the local minimum value, data corresponding to the local minimum value being divided into a next group; and for a group in the at least one group, determining a longest common prefix corresponding to the data in the group as the common prefix of the group.

In some embodiments, the method further includes: determining a compression ratio of the at least one piece of data; and in response to the compression ratio being less than a predetermined compression ratio threshold, sorting a non-common prefix portion of data in the each group in a predetermined order to generate a data set to be compressed in next round, and performing, based on the data set, multiple rounds of compression: for a piece of data in the data set, in response to the piece of data having a common prefix with a previous piece of data of the data, adding the common prefix to a multi-round common prefix set; dividing the data set into at least one group based on the multi-round common prefix set, and determining a common prefix of each group; updating the compression ratio of the at least one piece of data; and in response to the updated compression ratio being greater than or equal to the predetermined compression ratio threshold or a number of rounds of compression reaching a predetermined compression round number threshold, storing the common prefix of the each group and a non-common prefix portion of each piece of data in the each group, and recording a common prefix corresponding to the each piece of data in the each group and a shared length between the each piece of data and the common prefix. The method further includes: updating the data set to be compressed in the next round after sorting a non-common prefix portion of data in the each group in a predetermined order, and continuing performing the multiple rounds of compression, in response to the updated compression ratio being less than the predetermined compression ratio threshold and the number of the rounds of compression not reaching the predetermined compression round number threshold.

In some embodiments, the method further includes: for a piece of data in the data set, in response to the data having no common prefix with a previous piece of data of the data, adding the piece of data to the data set to be compressed in the next round.

In some embodiments, the determining a compression ratio of the at least one piece of data includes: determining a data capacity of the compressed at least one piece of data based on a number of bytes of the common prefix of the each group and a number of bytes of the non-common prefix portion of the data in the each group; and determining a ratio of the data capacity of the compressed at least one piece of data after being to a data capacity of the at least one piece of data before being compressed as the compression ratio.

In some embodiments, the method further includes: comparing a size of the each piece of data based on a common prefix corresponding to each piece of data in the at least one piece of data and a shared length between the each piece of data and the common prefix.

In a second aspect, some embodiments of the present disclosure provide an apparatus for processing data. The apparatus includes: a sorting unit, configured to sort at least one piece of to-be-compressed data in a predetermined order; a determining unit, configured to, for a piece of data in the sorted at least one piece of data, in response to the piece of data having a common prefix with a previous piece of data of the piece of data, add the common prefix to a common prefix set; a group unit, configured to divide the sorted at least one piece of data into at least one group based on the common prefix set and determining a common prefix of each group; and a storing unit, configured to, for a group in the at least one group, store a common prefix of the group and a non-common prefix portion of each piece of data in the group, and record a common prefix corresponding to each piece of data in the each group and a shared length between the each piece of data and the common prefix.

In some embodiments, the group unit is further configured to: determine a local minimum value of a length of a common prefix in the common prefix set; divide the at least one piece of data into the at least one group according to the local minimum value, data corresponding to the local minimum value being divided into a next group; and for a group in the at least one group, determine a longest common prefix corresponding to the data in the group as the common prefix of the group.

In some embodiments, the apparatus further includes a multi-round compression unit. The multi-round compression unit is configured to: determine a compression ratio of the at least one piece of data; and in response to the compression ratio being less than a predetermined compression ratio threshold, sort a non-common prefix portion of data in the each group in a predetermined order to generate a data set to be compressed in next round, and perform, based on the data set, multiple rounds of compression: for a piece of data in the data set, in response to the data having a common prefix with a previous piece of data of the piece of data, adding the common prefix to a multi-round common prefix set; dividing the data set into at least one group based on the multi-round common prefix set, and determining a common prefix of each group; updating the compression ratio of the at least one piece of data; and in response to the updated compression ratio being greater than or equal to the predetermined compression ratio threshold or a number of rounds of compression reaching a predetermined compression round number threshold, storing the common prefix of the each group and a non-common prefix portion of each piece of data in the each group, and recording a common prefix corresponding to the each piece of data in the each group and a shared length between the each piece of data and the common prefix. The multi-round compression unit is configured to: update the data set to be compressed in the next round after sorting a non-common prefix portion of data in the each group in a predetermined order, and continue performing the multiple rounds of compression, in response to the updated compression ratio is less than the predetermined compression ratio threshold and the number of the rounds of compression does not reach the predetermined compression round number threshold.

In some embodiments, the multi-round compression unit is further configured to: for a piece of data in the data set, in response to the data having no common prefix with the previous piece of data of the piece of data, adding the piece of data to the data set to be compressed in the next round.

In some embodiments, the multi-round compression unit is further configured to: determine a data capacity of the compressed at least one piece of data based on a number of bytes of the common prefix of the each group and a number of bytes of the non-common prefix portion of the data in the each group; and determine a ratio of the data capacity of the compressed at least one piece of data to a data capacity of the at least one piece of data before being compressed as the compression ratio.

In some embodiments, the apparatus further includes a comparing unit. The comparing unit is configured to: compare, according to a common prefix corresponding to each piece of data in the at least one piece of data and a shared length between the each piece of data and the common prefix, a size of the each piece of data.

In a third aspect, some embodiments of the present disclosure provide an electronic device. The electronic device includes: one or more processors; and a storage device, configured to store one or more programs. The one or more programs, when executed by the one or more processors, cause the one or more processors to implement the method described in any embodiment in the first aspect.

In a fourth aspect, some embodiments of the present disclosure provide a computer readable medium storing a computer program. The program, when executed by a processor, implements the method described in any embodiment in the first aspect.

According to the method and apparatus for processing data provided by some embodiments of the present disclosure, the at least one piece of to-be-compressed data is grouped and the common prefix of the each group is determined. Then, the data is compressed and stored according to the common prefix. Therefore, while the data compression efficiency is improved, input and output operations are reduced and memory resources are reduced. In addition, a storage capacity can also be reduced.

BRIEF DESCRIPTION OF THE DRAWINGS

After reading detailed descriptions of non-limiting embodiments given with reference to the following accompanying drawings, other features, objectives and advantages of the present disclosure will be more apparent.

DETAILED DESCRIPTION OF EMBODIMENTS

Embodiments of the present disclosure will be further described below in detail in combination with the accompanying drawings. It may be appreciated that the specific embodiments described herein are merely used for explaining the relevant disclosure, rather than limiting the disclosure. In addition, it should be noted that, for the ease of description, only the parts related to the relevant disclosure are shown in the accompanying drawings.

It should be noted that some embodiments in the present disclosure and some features in the disclosure may be combined with each other on a non-conflict basis. Features of the present disclosure will be described below in detail with reference to the accompanying drawings and in combination with the embodiments.

Figure 1:
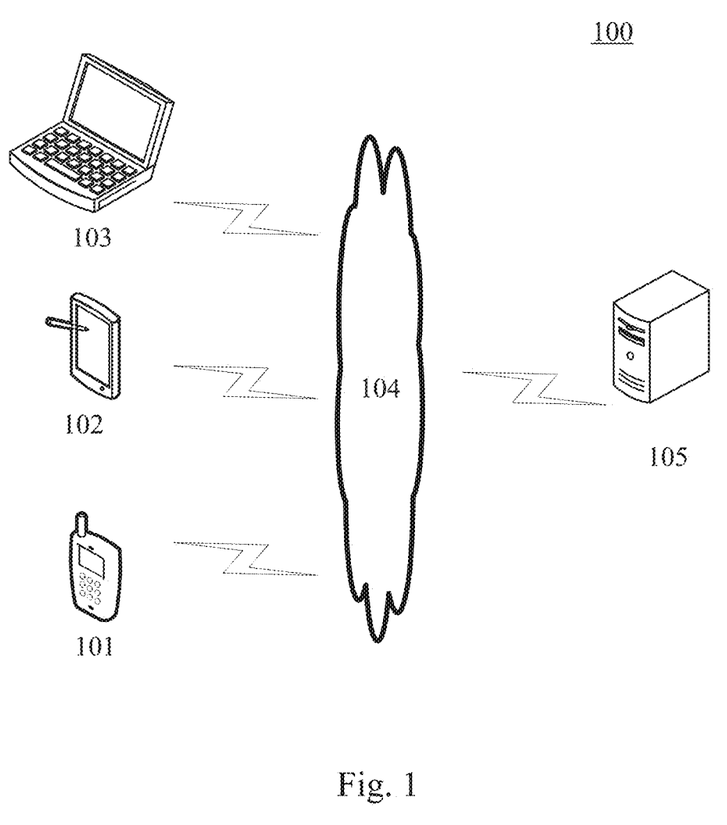
FIG. 1 is a diagram of an example system architecture in which an embodiment of the present disclosure may be applied.

FIG. 1 shows an example system architecture 100 in which a method for processing data or an apparatus for processing data may be applied.

As shown in FIG. 1, the system architecture 100 may include terminal devices 101, 102 and 103, a network 104 and a server 105. The network 104 serves as a medium providing a communication link between the terminal devices 101, 102 and 103 and the server 105. The network 104 may include various types of connections, for example, wired or wireless communication links, or optical fiber cables.

A user may interact with the server 105 via the network 104 by using the terminal devices 101, 102 and 103, to receive or send messages. Various communication client applications (e.g., a database management application, a webpage browser application, a shopping application, a search application, an instant communication tool, a mailbox client and social platform software) may be installed on the terminal devices 101, 102 and 103.

The terminal devices 101, 102 and 103 may be hardware or software. When being the hardware, the terminal devices 101, 102 and 103 may be various electronic devices having a display screen and supporting a database access function, the electronic devices including, but not limited to, a smart phone, a tablet computer, an e-book reader, an MP3 player (moving picture experts group audio layer III), an MP4 (moving picture experts group audio layer IV) player, a laptop portable computer and a desktop computer. When being the software, the terminal devices 101, 102 and 103 may be installed in the above-listed electronic devices. The terminal devices may be implemented as a plurality of pieces of software or a plurality of software modules (e.g., software or software modules for providing a distributed service), or as a single piece of software or a single software module, which will not be specifically defined here.

The server 105 may be a server providing various kinds of services, for example, a backend database server providing support for data content displayed on the terminal devices 101, 102 and 103. The backend database server may process (e.g., analyze) data such as a received data compression request, and feed back the processing result (e.g., the compressed data) to the terminal devices.

It should be noted that the server 105 may be hardware or software. When being the hardware, the server 105 may be implemented as a distributed server cluster composed of a plurality of servers, or as a single server. When being the software, the server 105 may be implemented as a plurality of pieces of software or a plurality of software modules (e.g., software or software modules for providing a distributed service), or as a single piece of software or a single software module, which will not be specifically defined here.

It should be noted that the method for processing data provided by some embodiments of the present disclosure may be performed by the terminal devices 101, 102 and 103, or may be performed by the server 105. Correspondingly, the apparatus for processing data may be provided in the terminal devices 101, 102 and 103, or may be provided in the server 105, which will not be specifically defined here.

It should be appreciated that the numbers of the terminal devices, the networks, and the servers in FIG. 1 are merely illustrative. Any number of terminal devices, networks and servers may be provided based on actual requirements.

Figure 2:
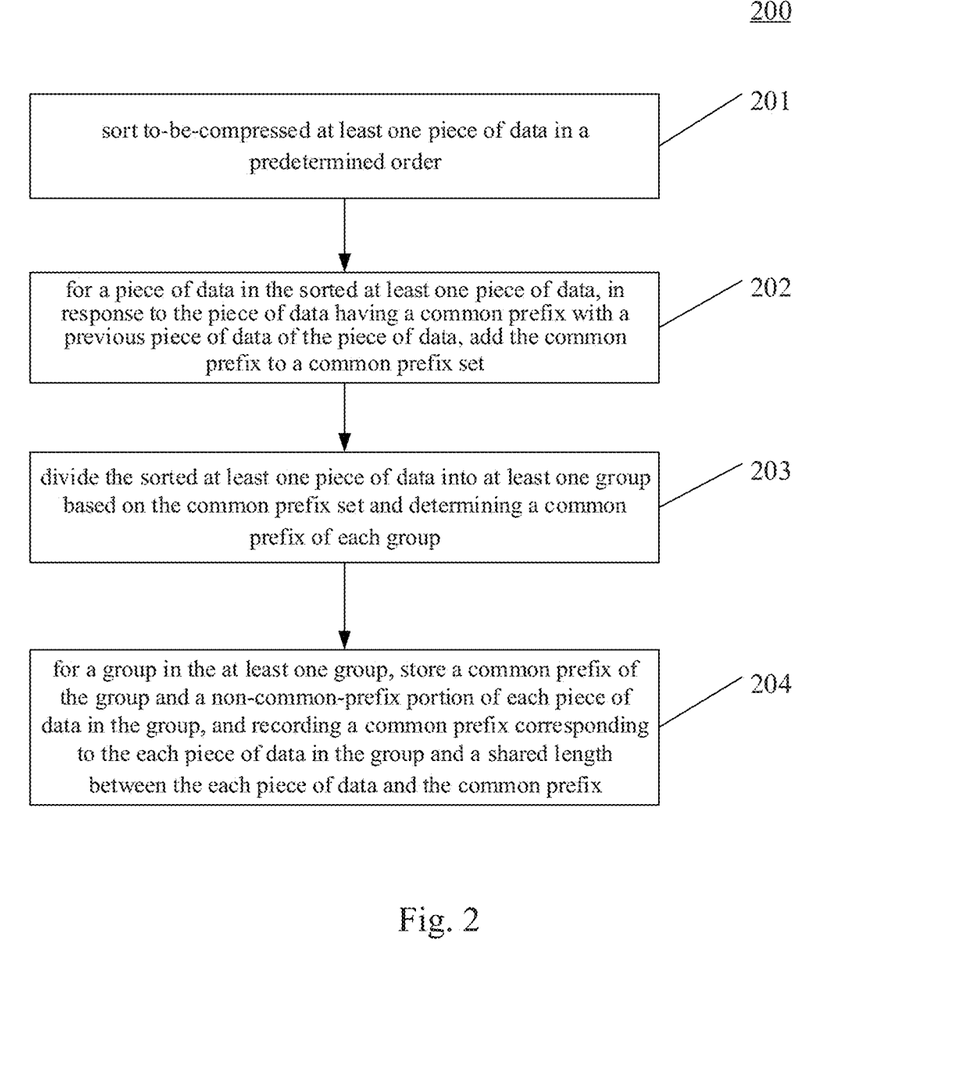
FIG. 2 is a flowchart of a method for processing data according to an embodiment of the present disclosure.

Further referring to FIG. 2, FIG. 2 illustrates a flow 200 of a method for processing data according to an embodiment of the present disclosure. The method for processing data includes the following steps:

Step 201, sorting to-be-compressed at least one piece of data in a predetermined order.

In this embodiment, an executing body (e.g., the server shown in FIG. 1) of the method for processing data may receive, from a terminal that is used by a user to perform data compression, a compression request by means of a wired connection or a wireless connection. The compression request may indicate at least one piece of to-be-compressed data. The at least one piece of to-be-compressed data is sorted in a predetermined order. The predetermined order may be a lexicographical order, or a number order. The at least one piece of to-be-compressed data is generally expressed in a form of a binary sequence, for example, an integer type, a floating point type, a string, an image, or audio and video content. Thus, in theory, as long as the content may be expressed in a continuous binary sequence, the compression may be performed thereon using the method in this embodiment. There is a guidance suggestion here that the compression effect is different for different contents. For example, for the string, the data is regular, the entropy is small, and the compression ratio may be made low. However, for a multimedia content such as the image, the binary data is not regular, the entropy is large, and the effect is not obvious. In the following description, the compression performed on the string is took as the example.

Step 202, for apiece of data in the sorted at least one piece of data, in response to the piece of data having a common prefix with a previous piece of data of the data, adding the common prefix to a common prefix set.

In this embodiment, the key point of an algorithm is how to find the common prefix of adjacent pieces of data. Given a set of data: "a", "ab", "abc", "abcf", "abx", "abxy", "aby" and "abyz". Table 1 is generated by taking the same prefix of the adjacent pieces of data. The content of the common prefix set is {"a", "ab", "abc", "abx", "aby"}. The duplicate common prefix needs to be filtered out before adding the common prefixes into the common prefix set. If there is no common prefix between one piece of data and other pieces of data, the piece of data may be retained for the next round of compression, and then, the common prefix of the data piece of and the data in the next round is determined.

TABLE 1

| Item | Common prefix with a previous | Data |
|------|-------------------------------|------|
| 1    |                               | "a"  |
| 2    | "a"                           | "ab" |
| 3    | "ab"                          | "abc"|
| 4    | "abc"                         | "abcf"|
| 5    | "ab"                          | "abx"|
| 6    | "abx"                         | "abxy"|
| 7    | "ab"                          | "aby"|
| 8    | "aby"                         | "abyz"|

Step 203, dividing the sorted at least one piece of data into at least one group based on the common prefix set and determining a common prefix of each group.

In this embodiment, the at least one piece of data may be grouped according to a number of pieces of data, for example, four pieces of data are divided into one group, then the data in Table 1 may be divided into two groups. The longest common prefix in each group is then determined as the common prefix of the group. For example, the first to fourth items of data are divided into one group, and the longest common prefix of the group is "abc" then "abc" may be used as the common prefix of the group. If there are more than one longest common prefix in one group, a common prefix that can match the most data may be selected as the common prefix of the group from the more than one longest common prefix.

In some alternative implementations of this embodiment, the dividing the sorted at least one piece of data into at least one group according to the common prefix set and determining a common prefix of each group includes: determining a local minimum value of a length of a common prefix in the common prefix set. The at least one piece of data is divided into the at least one group according to the local minimum value. Here, the data corresponding to the local minimum value is divided into the next group. For the at least one group, the longest common prefix corresponding to the data in the group is determined as the common prefix of the group.

Figure 3:
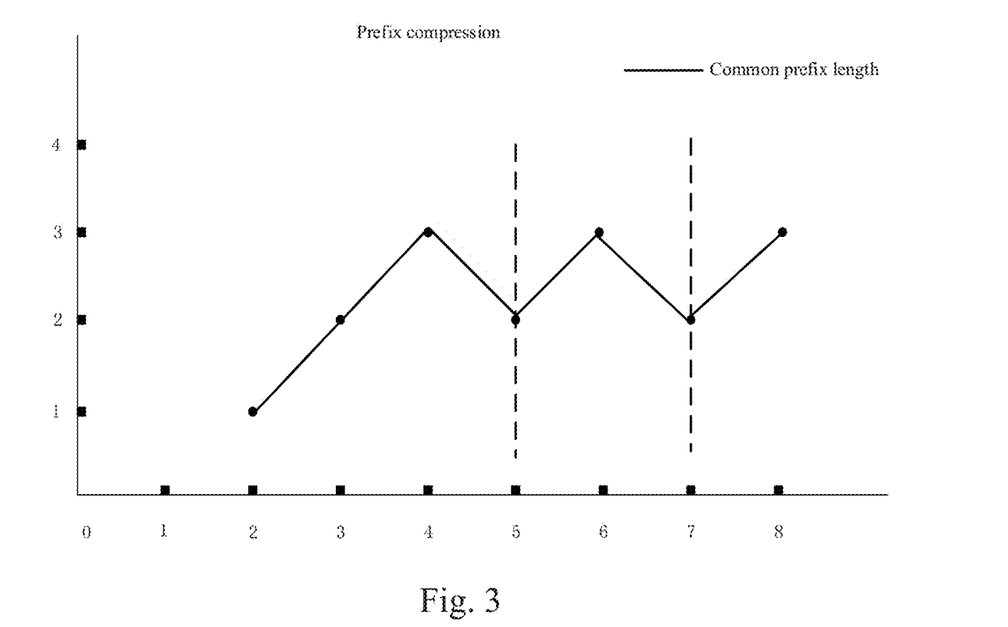
FIG. 3 is a common prefix line chart of the method for processing data according to an embodiment of the present disclosure.

The local minimum value of the length of the common prefix in the common prefix set may be as shown in FIG. 3. FIG. 3 may be drawn according to Table 1. In the drawing, an abscissa represents a data item, and an ordinate represents the length of the common prefix of this item of data and the previous item of data. For example, the abscissa "2" represents the second item "ab", and the common prefix of this item of data and the previous item of data is "a", that is, the length of the common prefix is 1. In the drawn line chart, the values corresponding to items 5 and 7 are the minimum value, that is, 5 and 7 are cut-off points. The data may be grouped by dashed lines, and points 5 and 7 where the minimum value is located are divided into the next groups. Items 1-4 are the first group, items 5 and 6 are the second group, and items 7 and 8 are the third group. The maximum value in the first group is the common prefix "abc" corresponding to the fourth item, and thus, "abc" is used as the common prefix of the first group. The maximum value in the second group is the common prefix "abx" corresponding to the sixth item, and thus, "abx" is used as the common prefix of the second group. The maximum value in the third group is the common prefix "aby" corresponding to the eighth item, and thus, "aby" is used as the common prefix of the third group.

Step 204, for a group in the at least one group, storing a common prefix of the group and a non-common prefix portion of each piece of data in the group, and recording a common prefix corresponding to each piece of data in the each group and a shared length between the each piece of data and the common prefix.

In this embodiment, the divided first group of data includes "a", "ab", "abc" and "abcf", and the common prefix is taken to be "abc" ((prefix)="abc"), then "a" may be represented by the prefix and the shared length is 1; "ab" may be represented by the prefix and the shared length is 2; "abc" may be represented by the prefix and the shared length is 3; and "abcf" may be represented by the prefix, the length is 3. The remaining string "f" as the input data of the next round of compression, is processed in the next round of prefix compression, or "f" may also be directly stored. When the data is stored, for data having a common prefix, it is only necessary to store the common prefix and record the shared length between the each piece of data and the common prefix at a specific location, this part of content, as metadata, is not counted into the data capacity. Thus, the original data may be restored when decompressed. Since a common prefix in a database may be very long, the overhead occupied by the information recording the location of the data is negligible.

In some alternative implementations of this embodiment, the method further includes: comparing a size of the each piece of data based on a common prefix corresponding to each piece of data in the at least one piece of data and a shared length between the each piece of data and the common prefix. Therefore, the data may be compared directly without decompression.

Figure 4:
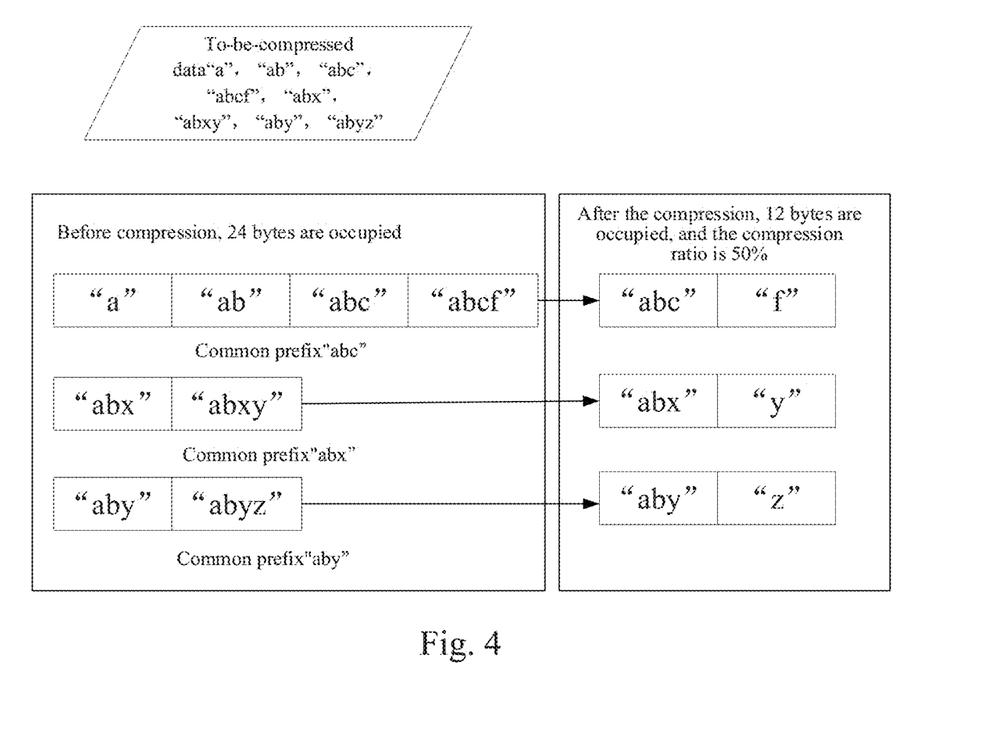
FIG. 4 is a schematic diagram of an application scenario of the method for processing data according an embodiment of to the present disclosure.

Further referring to FIG. 4, FIG. 4 is a schematic diagram of an application scenario of the method for processing data according to this embodiment. In the application scenario of FIG. 4, the to-be-compressed data are "a", "ab", "abc", "abcf", "abx", "abxy", "aby" and "abyz". The pieces of data are divided into three groups according to the common prefix, the first group includes "a", "ab", "abc" and "abcf", and the common prefix includes "abc". The second group is "abx" and "abxy", and the common prefix is "abx". The third group includes "aby" and "abyz", and the common prefix is "aby". In the first group of data, "a" may be represented by the common prefix "abc", the shared length is 1; "ab" may be represented by "abc", the shared length is 2; "abc" may be represented by "abc", the length is 3; and "abcf" may be represented by "abc", the length is 3. And the remaining string "f" is stored separately. The first group of data originally occupies 10 bytes, and the data may occupy a total of 4 bytes when represented by the common prefix "abc" and "f". In the second group of data, "abx" may be represented by the common prefix "abx", the shared length is 3; and "abxy" may be represented by "abx", the shared length is 3, and the remaining string "y" is stored separately. The second group of data originally occupies 7 bytes, and the data may occupy a total of 4 bytes when represented by the common prefix "abx" and "y". In the third group of data, "aby" may be represented by the common prefix "aby", the shared length is 3; and "abyz" may be represented by "aby," the shared length is 3, and the remaining string "z" is stored separately. The third group of data originally occupies 7 bytes, and the data may occupy a total of 4 bytes when represented by the common prefix "aby" and "z". The to-be-compressed data originally occupies 24 bytes, and the compressed data occupies 12 bytes. Thus, the compression ratio is 50%.

According to the method provided by some embodiments of the present disclosure, the data is compressed and stored through the common prefix, which reduces input and output operations and saves memory resources, and can also reduce the storage capacity.

Figure 5:
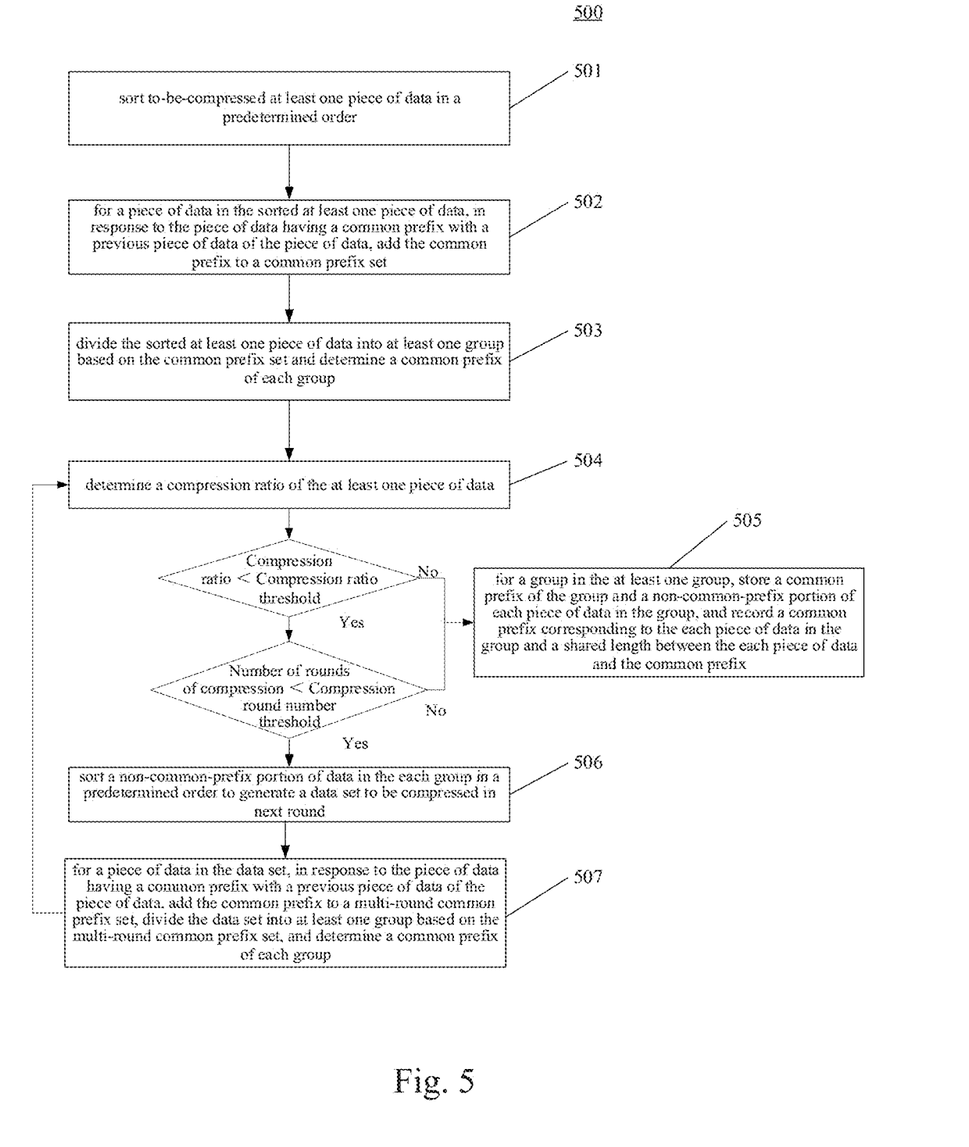
FIG. 5 is a flowchart of the method for processing data according to another embodiment of the present disclosure.

Further referring to FIG. 5, FIG. 5 illustrates a flow 500 of another embodiment of the method for processing data. The flow 500 of the method for processing data includes the following steps:

Step 501, sorting at least one piece of to-be-compressed data in a predetermined order.

Step 502, for a piece of data in the sorted at least one piece of data, n response to the piece of data having a common prefix with a previous piece of data of the piece of data, adding the common prefix to a common prefix set.

Step 503, dividing the sorted at least one piece of data into at least one group based on the common prefix set and determining a common prefix of each group.

Steps 501-503 are substantially the same as steps 201-203, which will not be repeatedly described here.

Step 504, determining a compression ratio of the at least one piece of data.

In this embodiment, the data capacity of the compressed at least one piece of data is determined based on a number of bytes of the common prefix of each group and a number of bytes of a non-common prefix portion of each piece of data in the each group. The ratio of the data capacity of the compressed at least one piece of data to a data capacity of the at least one piece of data before being compressed is determined as the compression ratio. For example, for the to-be-compressed data shown in FIG. 4, the data occupies 24 bytes before being compressed and occupies 12 bytes after being compressed, and thus, the compression ratio is 50%. If multiple rounds of compression are performed, the compression ratio is obtained by dividing the data capacity after the round of compression by the data capacity before the round of compression.

Step 505, for a group in the at least one group, storing a common prefix of the group and a non-common prefix portion of each piece of data in the group, and recording a common prefix corresponding to each piece of data in the each group and a shared length between the each piece of data and the common prefix, if the compression ratio is greater than or equal to a predetermined compression ratio threshold or a number of rounds of compression reaches a predetermined compression round number threshold.

Step 505 is substantially the same as step 204, which will not be repeatedly described here.

Step 506, if the compression ratio is less than the predetermined compression ratio threshold or the number of the rounds of compression does not reach the predetermined compression round number threshold, sorting a non-common prefix portion of data in the each group in a predetermined order to generate a data set to be compressed in next round.

In this embodiment, for example, a group of experimental data "ValueFile", "abc", "acbd", "acce", "adbde" and "adcf" is processed using a multi-round prefix compression algorithm. In the first round of compression, "ValueFile", "abc", "acbd", "acce", "adbde" and "adcf" are divided into three groups.

"ValueFile" does not have a common prefix with other data, and thus are divided into a separate group. The non-common prefix portion "ValueFile" may enter the next round of compression.

Here, "abc", "acbd" and "acce" are divided into one group, and the common prefix is "ac". Thus, "abc" may be represented by the common prefix "ac"+the non-common prefix "bc". That is, the non-common prefix portion "bc" may enter the next round of compression. Here, "acbd" may be represented by the common prefix "ac"+the non-common prefix "bd". That is, the non-common prefix portion "bd" may enter the next round of compression. Here, "acce" may be represented by the common prefix "ac"+the non-common prefix "ce". That is, the non-common prefix portion "ce" may enter the next round of compression. The to-be-stored common prefix of this group is "ac", and the data that may enter the next round of compression is "bc", "bd" and "ce".

Here, "adbde" and "adcf" are divided into group, and the common prefix is "ad". Thus, "adbde" may be represented by the common prefix "ad"+the non-common prefix "bde". That is, the non-common prefix portion "bde" may enter the next round of compression. Here, "adcf" may be represented by the common prefix "ad"+the non-common prefix "cf". That is, the non-common prefix portion "cf" may enter the next round of compression. The to-be-stored common prefix of this group is "ad", and the data that may enter the next round of compression is "bde" and "cf".

After the first round of compression, the number of occupied bytes is 9 ("ValueFile")+2 ("ac")+6 ("bc", "bd" and "ce")+2 ("ad")+5 ("bde" and "cf")=24. The compression ratio is 24/29=83%. Assuming that the compression threshold is 90%, it is required to continue the next round of compression.

The non-common prefix portions "ValueFile", "bc", "bd", "ce", "bde", "cf" are sorted in a predetermined order, to generate the data set {"bc", "bd", "bde", "ce", "cf", "ValueFile"} to be compressed in the next round.

Step 507, for a piece of data in the data set, in response to the piece of data having a common prefix with a previous piece of data of the piece of data, adding the common prefix to a multi-round common prefix set, dividing the data set into at least one group based on the multi-round common prefix set, and determining a common prefix of each group.

In this embodiment, the common prefixes "ac" and "ad" are added to the multi-round common prefix set. Here, "bc", "bd" and "bde" are divided into one group, the common prefix is "bd", and the non-common prefix portions are "c" and "e". Here, "ce" and "cf" are divided into one group, the common prefix is "c", and the non-common prefix portions are "e" and "f". "ValueFile" is one group, all of which are non-common prefixes.

The bytes occupied by the output data of the second round of compression is divided by the bytes occupied by the input data of the second round of compression, which is the compression ratio of the second round of compression. The output data of the second round of compression is ("ValueFile", "c", "bd", "c", "e", "f"), and the input data of the second round of compression is ("ValueFile", "bc", "bd", "bde", "ce", "cf"). Thus, the compression ratio of the second round of compression is 15/20=75%. Since there is no other common prefix, the next round of compression cannot be continued. Thus, step 505 is performed to store the common prefix and the non-common prefix. For example, the data "abc" may be represented by (the common prefix "ac"+the shared length 1)+(the common prefix "bd"+the shared length 1)+the non-common prefix "c". The data "acbd" may be represented by (the common prefix "ac"+the shared length 2)+(the common prefix "bd"+the shared length 2). After two rounds of compression, there is no longer a common prefix after the output data is sorted, and thus, the algorithm ends. After being compressed, the experimental data may be represented as 19 bytes ("ac", "ad", "ValueFile", "c", "bd", "c", "e" and "f"). The algorithm is further optimized, and finally, the common prefix obtained in each round of compression is integrated, and the same item is merged again. Since "c" is the same item in this link, "c" is merged. Therefore, the final data may be represented as 18 bytes. The data that needs to be stored eventually is the common prefixes "ac" and "ad" in the first round of compression, the common prefix "bd" in the second round of compression, and the remaining non-common prefixes "c", "e" and "f," as shown in Table 3.

The results are as shown in the table below. After the two rounds of prefix compression, the data area is reduced by 11 bytes.

Before the compression, 29 bytes are occupied.

TABLE 2

| "ValueFile" | "abc" | "acbd" |
| "acce" | "adbde" | "adcf" |

After the compression, 18 bytes are occupied.

TABLE 3

| "ValueFile" | "ac" | | "ad" | |
| "bd" | "c" | "e" | "f" | |

It may be seen from FIG. 5 that, as compared with the embodiment corresponding to FIG. 2, the flow 500 of the method for processing data in this embodiment reflects the step of performing multiple rounds of compression on the data. Thus, the compression ratio is improved, the input and output operations are reduced, the memory resources are saved, and the storage capacity can also be reduced.

Figure 6:
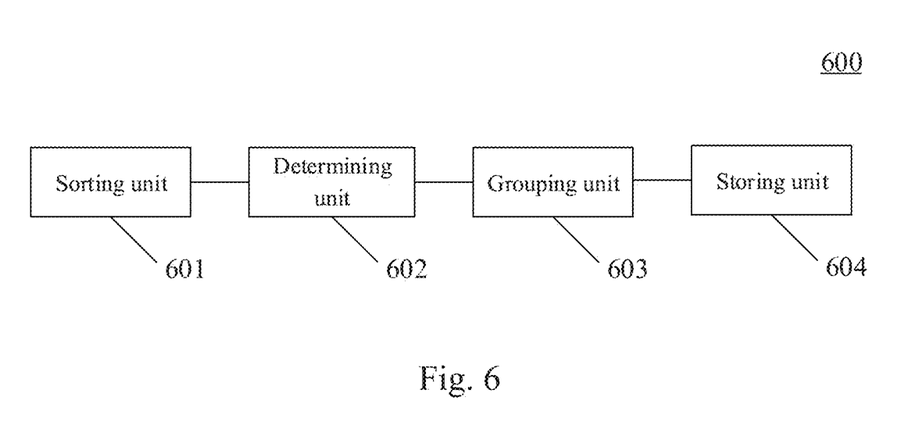
FIG. 6 is a schematic structural diagram of an apparatus for processing data according to an embodiment of the present disclosure.

Further referring to FIG. 6, as an implementation of the method shown in the above drawings, the present disclosure provides an embodiment of an apparatus for processing data. The embodiment of the apparatus corresponds to the embodiment of the method shown in FIG. 2, and the apparatus may be applied in various electronic devices.

As shown in FIG. 6, the apparatus 600 for processing data in this embodiment includes: a sorting unit 601, a determining unit 602, a group unit 603 and a storing unit 604. The sorting unit 601 is configured to sort at least one piece of to-be-compressed data in a predetermined order. The determining unit 602 is configured to, for a piece of data in the sorted at least one piece of data, in response to the piece of data having a common prefix with a previous piece of data of the piece of data, add the common prefix to a common prefix set. The group unit 603 is configured to divide the sorted at least one piece of data into at least one group based on the common prefix set and determining a common prefix of each group. The storing unit 604 is configured to store, for a group in the at least one group, a common prefix of the group and a non-common prefix portion of each piece of data in the group, and record a common prefix corresponding to each piece of data in the each group and a shared length between the each piece of data and the common prefix.

In this embodiment, for specific processes of the sorting unit 601, the determining unit 602, the group unit 603 and the storing unit 604 in the apparatus 600 for processing data, and their technical effects, reference may be made to step 201, step 202, step 203 and step 204 in the corresponding embodiment of FIG. 2 respectively.

In some alternative implementations of this embodiment, the group unit 603 is further configured to: generate a common prefix line chart based on the common prefix set and the sorted at least one piece of data, an abscissa of the common prefix line chart referring to data and an ordinate referring to a common prefix of a piece of data and the previous piece of data of the piece of data; determine a local minimum value point or a point having a value of 0 on the line of the common prefix line chart as a cut-off point; divide the data in the common prefix line chart into the at least one group according to the cut-off point, data corresponding to the cut-off point being divided into a next group; and for the at least one group, determine a longest common prefix corresponding to the data in the group as the common prefix of the group.

In some alternative implementations of this embodiment, the apparatus 600 further includes a multi-round compression unit (not shown). The multi-round compression unit is configured to: determine a compression ratio of the at least one piece of data; in response to the compression ratio being less than a predetermined compression ratio threshold, sort a non-common prefix portion of data in the each group in a predetermined order to generate a data set to be compressed in next round, and perform, based on the data set, multiple rounds of compression: for a piece of data in the data set, in response to the data having a common prefix with a previous piece of data of the piece of data, adding the common prefix to a multi-round common prefix set; dividing the data set into at least one group based on the multi-round common prefix set, and determining a common prefix of each group; updating the compression ratio of the at least one piece of data; and in response to the updated compression ratio being greater than or equal to the predetermined compression ratio threshold or a number of rounds of compression reaching a predetermined compression round number threshold, storing the common prefix of the each group and a non-common prefix portion of each piece of data in the each group, and recording a common prefix corresponding to the each piece of data in the each group and a shared length between the each piece of data and the common prefix. The multi-round compression unit is configured to: update the data set to be compressed in the next round after sorting a non-common prefix portion of data in the each group in a predetermined order, and continue performing the multiple rounds of compression, in response to the updated compression ratio being less than the predetermined compression ratio threshold and the number of the rounds of compression does not reach the predetermined compression round number threshold.

In some alternative implementations of this embodiment, the multi-round compression unit is further configured to: for a piece of data in the data set, in response to the data having no common prefix with a previous piece of data of the data, adding the piece of data to the data set to be compressed in the next round.

In some alternative implementations of this embodiment, the multi-round compression unit is further configured to: determine a data capacity of the compressed at least one piece of data based on a number of bytes of the common prefix of the each group and a number of bytes of the non-common prefix portion of the data in the each group; and determine a ratio of the data capacity of the compressed at least one piece of data to a data capacity of the at least one piece of data before being compressed as the compression ratio.

In some alternative implementations of this embodiment, the apparatus 600 further includes a comparing unit (not shown). The comparing unit is configured to: compare, according to a common prefix corresponding to each piece of data in the at least one piece of data and a shared length between the each piece of data and the common prefix, a size of the each piece of data.

Figure 7:
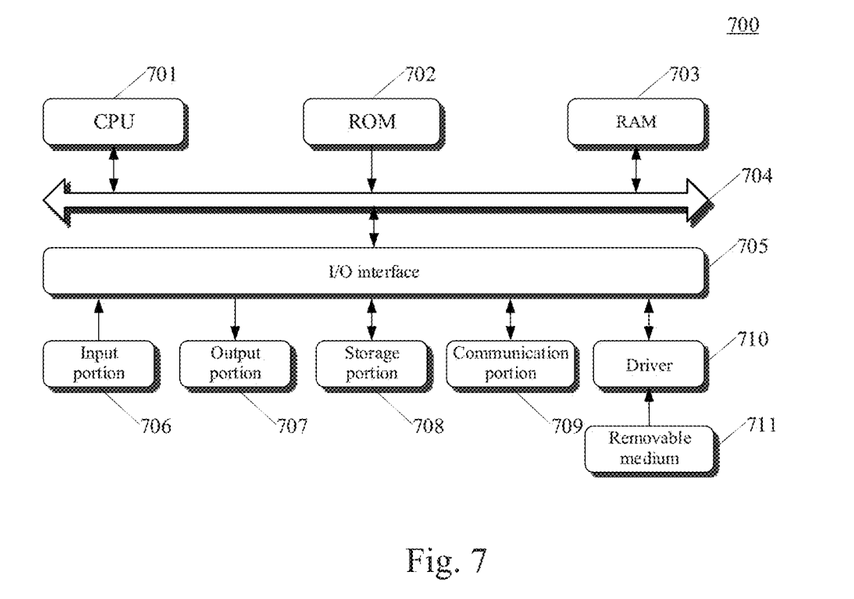
FIG. 7 is a schematic structural diagram of a computer system adapted to implement an electronic device according to some embodiments of the present disclosure.

Referring to FIG. 7, FIG. 7 is a schematic structural diagram of a computer system 700 adapted to implement an electronic device (e.g., the server shown in FIG. 1) of the embodiments of the present disclosure. The electronic device shown in FIG. 7 is merely an example, and should not bring any limitations to the functions and the scope of use of the embodiments of the present disclosure.

As shown in FIG. 7, the computer system 700 includes a central processing unit (CPU) 701, which may execute various appropriate actions and processes in accordance with a program stored in a read-only memory (ROM) 702 or a program loaded into a random access memory (RAM) 703 from a storage portion 708. The RAM 703 also stores various programs and data required by operations of the system 700. The CPU 701, the ROM 702 and the RAM 703 are connected to each other through a bus 704. An input/output (I/O) interface 705 is also connected to the bus 704.

The following components are connected to the I/O interface 705: an input portion 706 including a keyboard, a mouse, etc.; an output portion 707 including a cathode ray tube (CRT), a liquid crystal display device (LCD), a speaker, etc.; a storage portion 708 including a hard disk and the like; and a communication portion 709 including a network interface card such as a LAN (local area network) card and a modem. The communication portion 709 performs communication processes via a network such as the Internet. A driver 710 is also connected to the I/O interface 705 as required. A removable medium 711 such as a magnetic disk, an optical disk, a magneto-optical disk, and a semiconductor memory may be installed on the driver 710, to facilitate the retrieval of a computer program from the removable medium 711, and the installation thereof on the storage portion 708 as needed.

In particular, according to some embodiments of the present disclosure, the process described above with reference to the flowchart may be implemented as a computer software program. For example, an embodiment of the present disclosure includes a computer program product, including a computer program hosted on a computer readable medium, the computer program including program codes for performing the method as illustrated in the flowchart. In such an embodiment, the computer program may be downloaded and installed from a network via the communication portion 709, and/or may be installed from the removable medium 711. The computer program, when executed by the central processing unit (CPU) 701, implements the above mentioned functionalities defined in the method of the present disclosure. It should be noted that the computer readable medium in the present disclosure may be a computer readable signal medium, a computer readable storage medium, or any combination of the two. For example, the computer readable storage medium may be, but not limited to: an electronic, magnetic, optical, electromagnetic, infrared, or semiconductor system, apparatus, or element, or any combination of the above. A more specific example of the computer readable storage medium may include, but not limited to: an electrical connection having one or more wires, a portable computer disk, a hard disk, a random access memory (RAM), a read only memory (ROM), an erasable programmable read only memory (EPROM or flash memory), a fibre, a portable compact disk read only memory (CD-ROM), an optical memory, a magnet memory or any suitable combination of the above. In the present disclosure, the computer readable storage medium may be any physical medium containing or storing programs, which may be used by a command execution system, apparatus or element or incorporated thereto. In the present disclosure, the computer readable signal medium may include a data signal that is propagated in a baseband or as a part of a carrier wave, which carries computer readable program codes. Such propagated data signal may be in various forms, including, but not limited to, an electromagnetic signal, an optical signal, or any suitable combination of the above. The computer readable signal medium may also be any computer readable medium other than the computer readable storage medium. The computer readable medium is capable of transmitting, propagating or transferring programs for use by, or used in combination with, a command execution system, apparatus or element. The program codes contained on the computer readable medium may be transmitted with any suitable medium including, but not limited to, wireless, wired, optical cable, RF medium, or any suitable combination of the above.

A computer program code for executing the operations according to the present disclosure may be written in one or more programming languages or a combination thereof. The programming language includes an object-oriented programming language such as Java, Smalltalk and C++, and further includes a general procedural programming language such as "C" language or a similar programming language. The program codes may be executed entirely on a user computer, executed partially on the user computer, executed as a standalone package, executed partially on the user computer and partially on a remote computer, or executed entirely on the remote computer or a server. When the remote computer is involved, the remote computer may be connected to the user computer through any type of network, including a local area network (LAN) or a wide area network (WAN), or be connected to an external computer (e.g., connected through Internet provided by an Internet service provider).

The flowcharts and block diagrams in the accompanying drawings illustrate architectures, functions and operations that may be implemented according to the system, the method, and the computer program product of the various embodiments of the present disclosure. In this regard, each of the blocks in the flowcharts or block diagrams may represent a module, a program segment, or a code portion, the module, the program segment, or the code portion comprising one or more executable instructions for implementing specified logic functions. It should also be noted that, in some alternative implementations, the functions denoted by the blocks may occur in a sequence different from the sequences shown in the figures. For example, any two blocks presented in succession may be executed substantially in parallel, or they may sometimes be executed in a reverse sequence, depending on the function involved. It should also be noted that each block in the block diagrams and/or flowcharts as well as a combination of blocks may be implemented using a dedicated hardware-based system executing specified functions or operations, or by a combination of dedicated hardware and computer instructions.

The units involved in the embodiments of the present disclosure may be implemented by means of software or hardware. The described units may also be provided in a processor. For example, the processor may be described as: a processor comprising a sorting unit, a determining unit, a group unit and a storing unit. The names of these units do not in some cases constitute a limitation to such units themselves. For example, the sorting unit may alternatively be described as "a unit for sorting to-be-compressed at least one piece of data in a predetermined order."

In another aspect, the present disclosure further provides a computer readable medium. The computer readable medium may be the computer readable medium included in the apparatus described in the above embodiments, or a stand-alone computer readable medium not assembled into the apparatus. The computer readable medium carries one or more programs. The one or more programs, when executed by the apparatus, cause the apparatus to: sort to-be-compressed at least one piece of data in a predetermined order; for a piece of data in the sorted at least one piece of data, in response to the piece of data having a common prefix with a previous piece of data of the piece of data, add the common prefix to a common prefix set; divide the sorted at least one piece of data into at least one group based on the common prefix set and determining a common prefix of each group; and for a group in the at least one group, store a common prefix of the group and a non-common prefix portion of each piece of data in the group, and record a common prefix corresponding to each piece of data in the each group and a shared length between the each piece of data and the common prefix.

The above description is only an explanation for the preferred embodiments of the present disclosure and the applied technical principles. It should be appreciated by those skilled in the art that the inventive scope of the present disclosure is not limited to the technical solution formed by the particular combinations of the above technical features. The inventive scope should also cover other technical solutions formed by any combinations of the above technical features or equivalent features thereof without departing from the concept of the disclosure, for example, technical solutions formed by replacing the features as disclosed in the present disclosure with (but not limited to) technical features with similar functions.

What is claimed is:

1. A method for processing data, comprising:
   sorting to-be-compressed at least one piece of data in a predetermined order;
   for a piece of data in the sorted at least one piece of data, in response to the piece of data having a common prefix with a previous piece of data of the piece of data, adding the common prefix to a common prefix set;

dividing the sorted at least one piece of data into at least one group based on the common prefix set and determining a common prefix of each group, wherein dividing the sorted at least one piece of data comprises:
  determining a local minimum value of lengths of common prefixes in the common prefix set,
  diving the at least one piece of data in to the at least one group according to the local minimum value, data corresponding to the local minimum value being divided into a next group, and
  for a group in the at least one group, determining a longest common prefix corresponding to the data in the group as a common prefix of the group; and
for the group in the at least one group, storing the common prefix of the group and a non-common prefix portion of each piece of data in the group, and recording a common prefix corresponding to each piece of data in the each group and a shared length between the each piece of data and the common prefix.

2. The method according to claim 1, further comprising:
determining a compression ratio of the at least one piece of data;
in response to the compression ratio being less than a predetermined compression ratio threshold, sorting a non-common prefix portion of data in the each group in a predetermined order to generate a data set to be compressed in next round, and performing, based on the data set, multiple rounds of compression: for a piece of data in the data set, in response to the piece of data having a common prefix with a previous piece of data of the piece of data in the data set, adding the common prefix to a multi-round common prefix set; dividing the data set into at least one group based on the multi-round common prefix set, and determining a common prefix of each group; updating the compression ratio of the at least one piece of data; and in response to the updated compression ratio being greater than or equal to the predetermined compression ratio threshold or a number of rounds of compression reaching a predetermined compression round number threshold, storing the common prefix of the each group and a non-common prefix portion of each piece of data in the each group, and recording a common prefix corresponding to the each piece of data in the each group and a shared length between the each piece of data and the common prefix; and
in response to the updated compression ratio being less than the predetermined compression ratio threshold and the number of the rounds of compression not reaching the predetermined compression round number threshold, updating the data set to be compressed in the next round after sorting a non-common prefix portion of data in the each group in a predetermined order, and continuing performing the multiple rounds of compression.

3. The method according to claim 2, further comprising:
for a piece of data in the data set, in response to the data having no common prefix with a previous piece of data of the data, adding the piece of data to the data set to be compressed in the next round.

4. The method according to claim 2, wherein the determining a compression ratio of the at least one piece of data includes:
determining a data capacity of the compressed at least one piece of data based on a number of bytes of the common prefix of the each group and a number of bytes of the non-common prefix portion of the data in the each group; and
determining a ratio of the data capacity of the compressed at least one piece of data to a data capacity of the at least one piece of data before being compressed as the compression ratio.

5. The method according to claim 1, further comprising:
comparing sizes of pieces of data in the at least one piece of data based on a common prefix corresponding to the pieces of data in the at least one piece of data and shared lengths between the pieces of data in the at least one piece of data and the common prefix.

6. An apparatus for processing data, comprising:
at least one processor; and
a memory storing instructions, the instructions when executed by the at least one processor, causing the at least one processor to perform operations, the operations comprising:
  sorting to-be-compressed at least one piece of data in a predetermined order;
  for a piece of data in the sorted at least one piece of data, in response to the piece of data having a common prefix with a previous piece of data of the piece of data, adding the common prefix to a common prefix set;
  dividing the sorted at least one piece of data into at least one group based on the common prefix set and determining a common prefix of each group, wherein dividing the sorted at least one piece of data comprises:
    determining a local minimum value of lengths of common prefixes in the common prefix set,
    diving the at least one piece of data in to the at least one group according to the local minimum value, data corresponding to the local minimum value being divided into a next group, and
    for a group in the at least one group, determining a longest common prefix corresponding to the data in the group as a common prefix of the group; and
  for the group in the at least one group, storing the common prefix of the group and a non-common prefix portion of each piece of data in the group, and recording a common prefix corresponding to each piece of data in the each group and a shared length between the each piece of data and the common prefix.

7. The apparatus according to claim 6, wherein the operations further comprise:
determining a compression ratio of the at least one piece of data;
in response to the compression ratio being less than a predetermined compression ratio threshold, sorting a non-common prefix portion of data in the each group in a predetermined order to generate a data set to be compressed in next round, and performing, based on the data set, multiple rounds of compression: for a piece of data in the data set, in response to the data having a common prefix with a previous piece of data of the piece of data, adding the common prefix to a multi-round common prefix set; dividing the data set into at least one group based on the multi-round common prefix set, and determining a common prefix of each group; updating the compression ratio of the at least one piece of data; and in response to the updated compression ratio being greater than or equal to the predetermined compression ratio threshold or a number of rounds of compression reaching a predetermined compression round number threshold, storing the common prefix of the each group and a non-common prefix portion of each piece of data in the each group, and recording a common prefix corresponding to the each piece of data in the each group and a shared length between the each piece of data and the common prefix; and in response to the updated compression ratio being less than the predetermined compression ratio threshold and the number of the rounds of compression not reaching the predetermined compression round number threshold, updating the data set to be compressed in the next round after sorting a non-common prefix portion of data in the each group in a predetermined order, and continue performing the multiple rounds of compression.

8. The apparatus according to claim 7, wherein the operations further comprise:

for a piece of data in the data set, in response to the data having no common prefix with a previous piece of data of the data, adding the piece of data to the data set to be compressed in the next round.

9. The apparatus according to claim 7, wherein the determining a compression ratio of the at least one piece of data includes:

determining a data capacity of the compressed at least one piece of data based on a number of bytes of the common prefix of the each group and a number of bytes of the non-common prefix portion of the data in the each group; and determining a ratio of the data capacity of the compressed at least one piece of data to a data capacity of the at least one piece of data before being compressed as the compression ratio.

10. The apparatus according to claim 6, wherein the operations further comprise:

comparing sizes of pieces of data in the at least one piece of data based on a common prefix corresponding to the pieces of data in the at least one piece of data and shared lengths between the pieces of data in the at least one piece of data and the common prefix.

11. A non-transitory computer readable medium, storing a computer program, wherein the program, when executed by a processor, causes the processor to perform operations, the operations comprising:

sorting to-be-compressed at least one piece of data in a predetermined order;

for a piece of data in the sorted at least one piece of data, in response to the piece of data having a common prefix with a previous piece of data of the piece of data, adding the common prefix to a common prefix set;

dividing the sorted at least one piece of data into at least one group based on the common prefix set and determining a common prefix of each group, wherein dividing the sorted at least one piece of data comprises:

determining a local minimum value of lengths of common prefixes in the common prefix set, diving the at least one piece of data in to the at least one group according to the local minimum value, data corresponding to the local minimum value being divided into a next group, and for a group in the at least one group, determining a longest common prefix corresponding to the data in the group as a common prefix of the group; and for the group in the at least one group, storing the common prefix of the group and a non-common prefix portion of each piece of data in the group, and recording a common prefix corresponding to each piece of data in the each group and a shared length between the each piece of data and the common prefix.

12. The medium according to claim 11, wherein the operations further comprise:

determining a compression ratio of the at least one piece of data;

in response to the compression ratio being less than a predetermined compression ratio threshold, sorting a non-common prefix portion of data in the each group in a predetermined order to generate a data set to be compressed in next round, and performing, based on the data set, multiple rounds of compression: for a piece of data in the data set, in response to the piece of data having a common prefix with a previous piece of data of the piece of data, adding the common prefix to a multi-round common prefix set; dividing the data set into at least one group based on the multi-round common prefix set, and determining a common prefix of each group; updating the compression ratio of the at least one piece of data; and in response to the updated compression ratio being greater than or equal to the predetermined compression ratio threshold or a number of rounds of compression reaching a predetermined compression round number threshold, storing the common prefix of the each group and a non-common prefix portion of each piece of data in the each group, and recording a common prefix corresponding to the each piece of data in the each group and a shared length between the each piece of data and the common prefix; and in response to the updated compression ratio being less than the predetermined compression ratio threshold and the number of the rounds of compression not reaching the predetermined compression round number threshold, updating the data set to be compressed in the next round after sorting a non-common prefix portion of data in the each group in a predetermined order, and continuing performing the multiple rounds of compression.

13. The medium according to claim 12, wherein the operations further comprise:

for a piece of data in the data set, in response to the data having no common prefix with a previous piece of data of the data, adding the piece of data to the data set to be compressed in the next round.

14. The medium according to claim 12, wherein the determining a compression ratio of the at least one piece of data includes:

determining a data capacity of the compressed at least one piece of data based on a number of bytes of the common prefix of the each group and a number of bytes of the non-common prefix portion of the data in the each group; and determining a ratio of the data capacity of the compressed at least one piece of data to a data capacity of the at least one piece of data before being compressed as the compression ratio.

15. The medium according to claim 11, wherein the operations further comprise:

comparing sizes of pieces of data in the at least one piece of data based on a common prefix corresponding to the pieces of data in the at least one piece of data and shared lengths between the pieces of data in the at least one piece of data and the common prefix.

* * * * *

UNITED STATES PATENT AND TRADEMARK OFFICE
CERTIFICATE OF CORRECTION

PATENT NO. : 10,797,724 B2
APPLICATION NO. : 16/567950
DATED : October 6, 2020
INVENTOR(S) : Rui Yang et al.

Page 1 of 1

It is certified that error appears in the above-identified patent and that said Letters Patent is hereby corrected as shown below:

In the Claims

In Column 15, Line 7, Claim 1, delete "diving" and insert --dividing--.

In Column 15, Line 7, Claim 1, delete "in to" and insert --into--.

In Column 16, Line 32, Claim 6, delete "diving" and insert --dividing--.

In Column 16, Line 32, Claim 6, delete "in to" and insert --into--.

In Column 17, Line 56, Claim 11, delete "diving" and insert --dividing--.

In Column 17, Line 56, Claim 11, delete "in to" and insert --into--.

Signed and Sealed this
Fifth Day of January, 2021

Andrei Iancu
*Director of the United States Patent and Trademark Office*